United States Patent
Neogi et al.

(10) Patent No.: US 8,431,188 B2
(45) Date of Patent: Apr. 30, 2013

(54) ABRASION RESISTANT COATINGS WITH COLOR COMPONENT FOR GEMSTONES AND SUCH

(76) Inventors: Suneeta Neogi, Temecula, CA (US); Jayant Neogi, Temecula, CA (US)

( * ) Notice: Subject to any disclaimer, the term of this patent is extended or adjusted under 35 U.S.C. 154(b) by 2128 days.

(21) Appl. No.: 11/356,512

(22) Filed: Feb. 17, 2006

(65) Prior Publication Data

US 2006/0182883 A1 Aug. 17, 2006

Related U.S. Application Data

(60) Provisional application No. 60/654,278, filed on Feb. 17, 2005.

(51) Int. Cl.
*C23C 16/00* (2006.01)
(52) U.S. Cl.
USPC .................................. 427/248.1; 427/249.1
(58) Field of Classification Search ............... 427/248.1, 427/249.1
See application file for complete search history.

(56) References Cited

U.S. PATENT DOCUMENTS

| | | | |
|---|---|---|---|
| 3,490,250 A | | 1/1970 | Jones |
| 5,853,826 A * | | 12/1998 | Starcke et al. ................. 428/15 |
| 5,882,786 A * | | 3/1999 | Nassau et al. ................ 428/336 |
| 6,221,493 B1 * | | 4/2001 | Reineck et al. .............. 428/408 |

FOREIGN PATENT DOCUMENTS

EP 0 248 525 12/1987

* cited by examiner

*Primary Examiner* — Kelly M Gambetta
(74) *Attorney, Agent, or Firm* — Marger, Johnson & McCollom PC

(57) ABSTRACT

In accordance with the present invention, there are provided methods for imparting abrasion wear resistant color to "gemstones" by providing an integrated coating consisting of the color imparting agent and the abrasion wear resistant agent. The color imparting agent may provide the perception of color via interference phenomena or via bulk absorption phenomena. Abrasion wear resistance may be provided by integrating any of the materials such as DLC (diamond-like carbon), CVD diamond (CVDD), alumina, polymer-based materials, nitrides and carbonitrides. Abrasion wear resistant properties of DLC or CVDD may be further improved, in addition to improvement of other mechanical properties and inducing hydrophobicity, by incorporating certain elements into the deposited film.

17 Claims, 5 Drawing Sheets

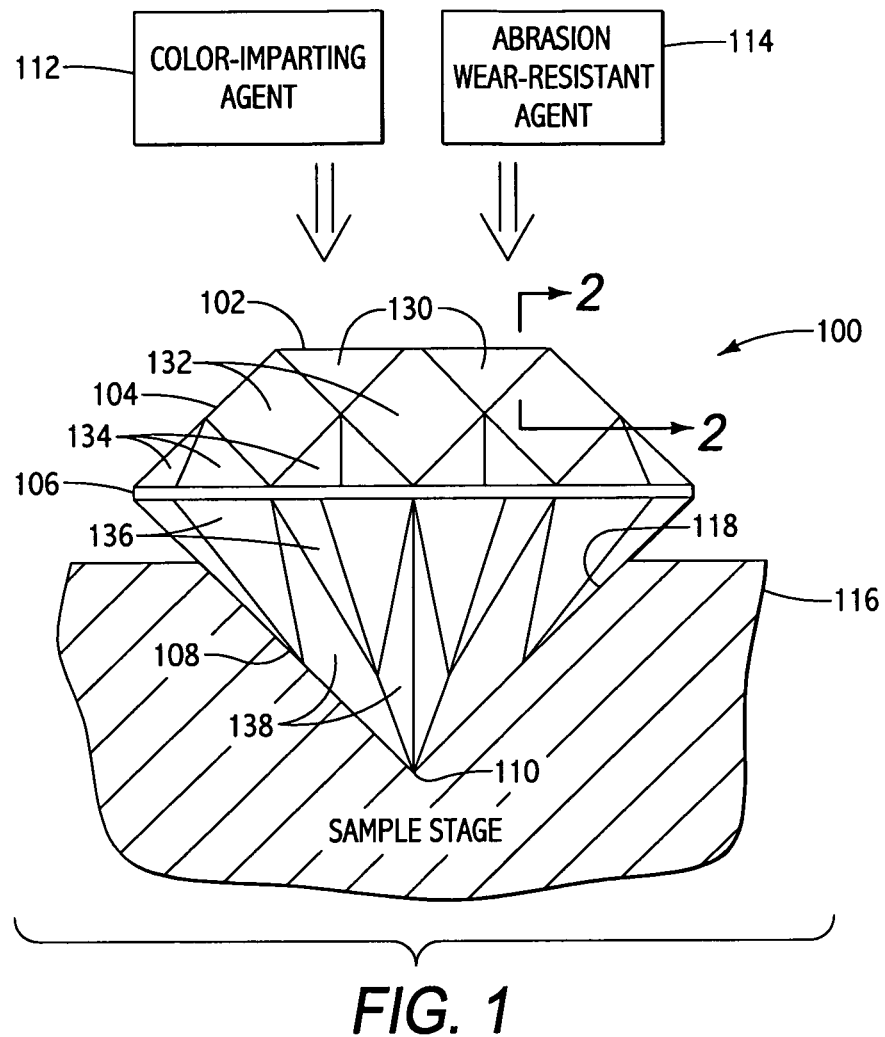
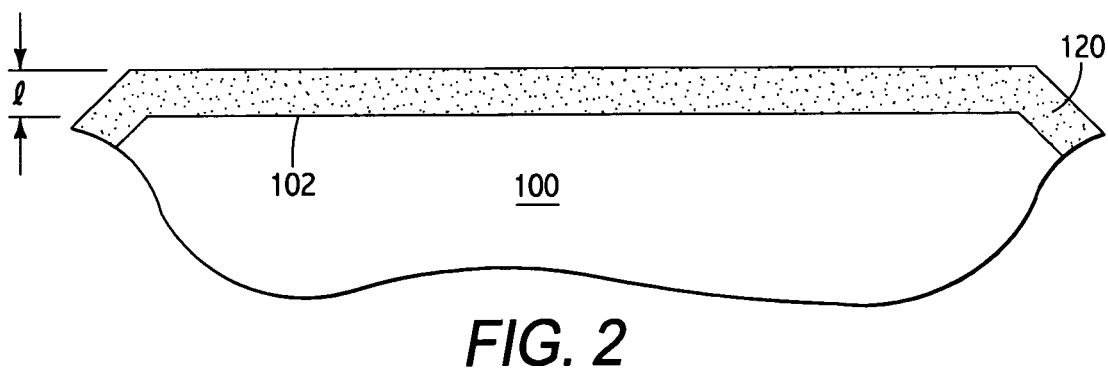

ABRASION RESISTANT COATINGS WITH COLOR COMPONENT FOR GEMSTONES AND SUCH

1. CROSS-REFERENCES TO RELATED APPLICATIONS

This application claims the benefit from U.S. Provisional Patent Application No. 60/654,278 filed Feb. 17, 2005 whose contents are incorporated herein for all purposes.

BACKGROUND OF THE INVENTION

2. Field of the Invention

This invention relates generally to abrasion-resistive coatings and more particularly to such coatings used on gemstones, pearls, crystals, and metal jewelry to improve wear resistance on softer materials as well as impart color via various methods.

3. Description of the Prior Art

Coloration of gemstones has gained in popularity as a way to improve the color characteristics of natural stones with poor color, or to impart natural and synthetic stones with new and unique shades. The gemstone industry currently produces some specific shades via metal or metal oxide coatings, but such treatments are not robust and can get easily damaged by chemicals or by mechanical abrasion. Additionally the choice of coatings used for imparting color to the gemstone are limited to those that can be deposited to provide an adherent coating on the gemstone material. And although multilayer coatings using thin films is possible, stresses can easily lead to cracking, peeling and flaking of the coatings.

Currently, Tavalite® and Mystic Fire® brand topaz coatings use mixtures of metal oxides in a low pressure chemical vapor deposition (LPCVD) process to produce dichroic color patterns as in Tavalite and rainbow effect through vacuum deposition metal/metal oxide atoms as in Mystic Fire. In the case of Tavalite, the coating is present on both sides. In the case of Mystic Fire, the coating is present either on the pavilion side or on the crown side (called Nirvana topaz). These and other color coating treatments on gemstones can be easily damaged by scratching, exposure to abrasives, and chemicals (e.g. pickling solutions).

Other methods of color treatment include a form of sintering process. In the sintering process, the color imparting agent is in the form of a powder that is packed around the gemstone and thereafter exposed to elevated temperatures for long periods of time. In this process the coloring agent diffuses into the near-surface of the gemstone. A known drawback to the sintering method of colorization is that any damage to the gemstone such as scratches, dings, or abrasion will easily reveal the colorless gemstone material from behind.

In yet another form of color treatment, gemstones are irradiated with energetic beams to induce color centers. One drawback of this method, however, is that irradiated gemstones may lose their color over time when exposed to light.

Metal jewelry—such as that made with noble metals such as platinum or gold or other metals such as rhodium, titanium, tungsten, etc.—is susceptible to micro-scratches which greatly affect its appearance over time. These micro-scratches result from the general wear and tear caused by potential customers handling the jewelry in retail showrooms and subsequently wearing the jewelry, thereby causing the product to lose its finish and shine.

The prior art only teaches methods for producing specific colors to gemstones via metal or metal oxide coating depositions, diffusion treatments or irradiation. This resulting color, however, is susceptible to damage. Accordingly, the need remains for improved means and methods to impart colored or uncolored protective layers to gemstones, precious metal jewelry, and the like that do not decrease the decorative desirability of the object so protected.

SUMMARY OF THE INVENTION

The invention provides the ability to produce gems (including pearls) in any desired color via the choice of material (metal, oxide, alloy, composite) deposited in conjunction with a diamond-like carbon deposition (DLC, CVD diamond (CVDD), alumina or other hard coatings from the class of nitrides/carbonitrides) to provide abrasion wear resistance as well as resistance to chemicals or cleaners. The color perceived may be a result of essential optical effects including Fresnel reflection, volume absorption and light dispersion. The invention can, in one embodiment, include the use of sol gel substances or, in another embodiment, using ion implantation of monomer or cluster ions.

The invention describes methods for protection of treatments provided to gems including but not limited to treatments such as the oil treatments provided to emeralds, irradiation treatments provided to topaz etc. in addition to providing abrasion wear resistance to natural gemstones whose mechanical properties make them prone to being scratched such as Apatite, Chrome diospside, Emeralds etc.

The invention also describes methods for imparting abrasion resistant colors to gemstones using a two-step process wherein the first step uses methods for imparting a single color to a clear gem (natural or synthetic) via one of several methods disclosed in the invention followed by a second step using an abrasion resistant coating with or without a color component.

The invention also discloses methods for achieving a desired color effect in a gem via the abrasion resistant coating with a color component by utilizing the light performance of a gem based upon the cut and facet approach imparted to the gem.

The invention also describes abrasive-resistant coatings for metal jewelry such as rings and the like. Additionally, methods are disclosed for creating diamond watch dials via deposition of the diamond film and/or co-deposition of diamond plus color imparting agent over other substrate material or free standing diamond wafer dials which are claimed here as a novel product.

The invention further describes a process for coating metals, such as used in watch dials, to achieve certain decorative effects.

The invention also describes methods for improving the color characteristics of colored gems (natural and synthetic) and methods for imparting secondary/tertiary colors to colored gems (natural and synthetic).

Finally, the invention further describes methods for placement of visible brands upon the cut surfaces of a gemstone or other materials which are protected by abrasion wear resistant coatings.

The foregoing and other objects, features and advantages of the invention will become more readily apparent from the following detailed description of a preferred embodiment of the invention that proceeds with reference to the accompanying drawings.

BRIEF DESCRIPTION OF THE DRAWINGS

FIG. 1 is a schematic diagram of a gemstone showing a first deposition step of the preferred coloration method.

FIG. 2 is a section view taken along line 2—2 showing the resulting coating from the first deposition step of FIG. 1.

DETAILED DESCRIPTION

Figure 3:
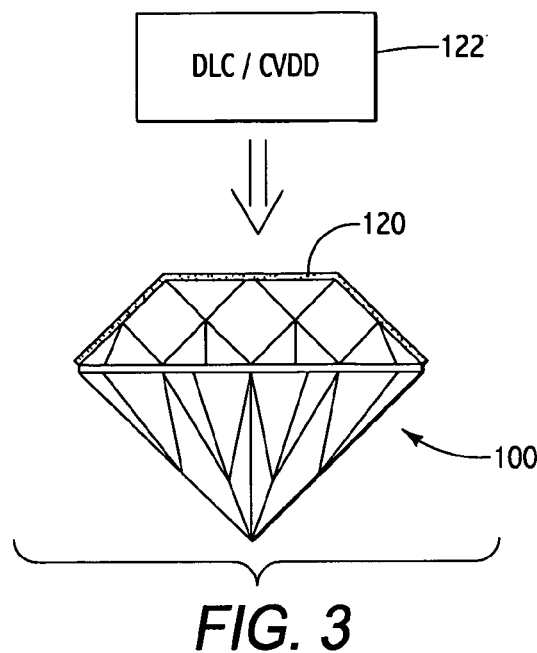
FIG. 3 is a second view of a gemstone showing a second deposition step to impart an abrasive resistant layer to the gemstone.

The present invention is directed to methods and systems adapted to impart a wear resistant layer over gemstones and jewelry. The need for such an improvement exists as there is no method currently practiced within the industry wherein a color treatment can be imparted to the gemstone that is resistant to abrasion, wear, handling, harsh chemicals, elevated temperatures, and exposure to light. Additionally, there is no method currently practiced wherein abrasion resistance can be imparted to precious metal jewelry.

The addition of color components to gemstones is a recognized method for "enhancing" the stone to increase its value. There are, however, no methods currently practiced wherein the natural color existing in a gemstone (natural or synthetic) can be improved via application of an abrasion resistant coating containing a color component that either improves the existing color characteristics, or is used to color match a stone with poor color characteristics by enhancing or improving its color to match another stone which already has a desired color characteristic, or imparts secondary or tertiary colors to the gem. Additionally there are no methods currently practiced today wherein a natural gem is protected with an abrasion wear resistance treatment to improve the surface mechanical properties as well as protect the treatments within.

Color control is key. There are no known methods currently practiced today wherein the cut of a gem is uniquely integrated with the abrasion resistance treatment with color component is applied to it such that the gem displays a desired color characteristic, color effects and brilliance. Additionally, there are no methods currently practiced today wherein the abrasion resistant treatment with or without a color component is applied as a second step in color treatment of a clear gem which has first been induced with a base color via other treatment methods such as sol gel deposition of oxides, nitrides, oxynitrides, or carbides etc. of preferred metals and subsequently exposed to elevated temperatures for curing. Furthermore, there are no methods currently practiced today wherein a color is imparted to a clear gem (natural or synthetic) by the process of implantation of monomer or cluster ions into the body of gemstone which may be followed by a second step of an abrasion resistant color application to create secondary or tertiary color effects.

Development of multicolor effects in a clear or colored gemstone can also be achieved by the method of selective application of abrasion resistant color treatment to particular facets, or sections (girdle, crown, pavilion, or any regions of gemstone demarcated by vertical or horizontal demarcations) of the gemstone by masking certain other facets or sections. Additionally the masked facets can be unmasked and a second application of abrasion wear resistant color treatment can be done while the previously treated facets are masked. Multiple such applications can be done based upon the specific pattern of color or multi-color effects desired. Alternatively a sol gel application to selected facets of the stone by masking method and subsequent curing allows the creation of a single color to certain facets. The masked facets can be thereafter unmasked and treated with additional sol gel applications after masking the previously treated facets so as to induce a different single color to certain facets. The gems are further treated with application of an abrasion wear resistant coating with or without color component to develop the multi-color effect in a particular desired pattern.

Finally, the branding of gemstones is becoming a common practice within the industry. There are, however, no methods currently practiced today wherein decorative symbol, characters or picture is embedded within an abrasive wear resistant layer that is applied to the crown of the gemstone such that the table of the gemstone in addition to having a natural color or a color treatment also has a visible decorative brand that lends some special meaning to the wearer.

I. Equipment/Method:

The technique and/or apparatus used for achieving the abrasion and wear resistant color treatments includes, in a preferred embodiment, direct ion beam deposition, ion-assisted deposition and RF plasma based systems. Commercially available systems that can be adapted to apply the wear-resistant coatings include Diamonex RF plasma/ion beam/Magnetron sputtering batch systems or a gas-cluster ion beam (GCIB) apparatus as described below. CVD diamond deposition may be deposited via hot filament, microwave plasma or gas cluster ion beam (GCIB)-based apparatus. A radically different method of providing color treatments is by sol gel techniques including dip coating, spray coating, flow coating, spin coating or capillary coating processes. A color treatment provided by such wet coating process would be followed by appropriate curing treatments and deposition of abrasion wear resistant optically clear film.

II. Vacuum Deposition Methods

A) Gemstones, Diamonds, Crystals, Pearls

Color can affect the value of certain gemstones. For instance, natural brown diamonds, because of their brown color, are not valued very highly. Colorless gemstones, such as varieties of topaz, cubic zirconia, moissanite, sapphire, etc., and crystals, do not hold much value because of the absence of color. The invention will use the term "gemstones" to refer to any or all of the above decorative articles.

FIG. 1 illustrates the co-deposition process according to a preferred embodiment of the invention. The gemstone, shown at 100, has been cut to provide a finished shape. The cut features of gemstone 100 generally include a flat upper surface termed a table 102, an upper section termed a crown 104 showing a faceted frustoconical shape, a girdle 106 at the base of crown 104, a narrowing pavilion 108 on the underside of the gemstone 100, and a cutlet 110 formed at the tip of the pavilion. It is understood by those in the industry that such gemstones can have a variety of different shapes, facets, and features and that the present invention is not necessarily limited to the specific arrangement shown in FIG. 1. The co-deposition steps are characterized in block 112 (for the color-imparting agent) and in block 114 (for the abrasion wear-resistant agent).

Gemstone 100 is shown mounted within stage 116 during the deposition process. Stage 116 is characterized in a preferred embodiment by a circular flat plate on which have been machined various features used to hold the gemstones. For stones that are to be seated with crown side up, as shown in FIG. 1, long continuous grooves (such as groove 118) are machined into the plate. The width of the grooves 118 are varied to accommodate various sizes of stones. Alternately, the stage 116 can include circular holes that taper as they go into depth so that the gemstones can sit with pavilion down, again as in shown in FIG. 1. Finally, circular depressions (depth is about a mm or less) of specific diameters can be formed in the stage based upon the size of stones to be mounted thereon. By doing this, the stones are place crown side down so that the table of the gemstone is flat within the depression for deposition coverage of the pavilion of the stone.

In accordance with a preferred embodiment of the present invention, there are provided methods for imparting abrasion wear resistant color and in some cases the added property of hydrophobicity to gemstones by providing an integrated coating consisting of the color imparting agent and the abrasion wear resistant agent. The color imparting agent may provide the perception of color via interference phenomena or via bulk absorption phenomena. Abrasion wear resistance may be provided by integrating any of the materials such as DLC (diamond-like carbon), CVD diamond (CVDD), alumina, polymer-based materials, nitrides and carbonitrides. In the case of DLC and H-DLC (hydrogenated DLC) films alloying with elements such as F, B, N or Si leads to improved wear resistance, hydrophobicity (this has an important application in that it is a means to reduce surface contamination that is a natural result of day to day usage), adhesion, hardness, stress and oxidation resistance.

FIG. 2 illustrates the resulting structure of the co-deposition process shown in FIG. 1. As the gemstone 100 is mounted on the stage 116 with the crown-side 102 up, a co-deposited wear resistant color matrix 120 is formed over the crown of the gemstone to a thickness l dictated by the performance characteristics of the deposition equipment used and the requirements needed for the matrix 120.

In one embodiment, metal or semiconductor atoms or other elements (e.g. Au, Pt, Cr, Fe, Si, Ge, etc.) and DLC or CVDD are concurrently deposited on the gemstone up to a certain thickness. Other colorization materials of interest include Bi, Ni, Co, Ta, Er, Mn, Mg, Al, Zr, Ti, Se, and Be. Still further colorization materials of interest include binary or tertiary alloys of various metals including but not limited to the elements listed above. The DLC or CVDD deposition is then continued for a specified thickness/period while the elemental species atom deposition is deactivated.

Figure 4:
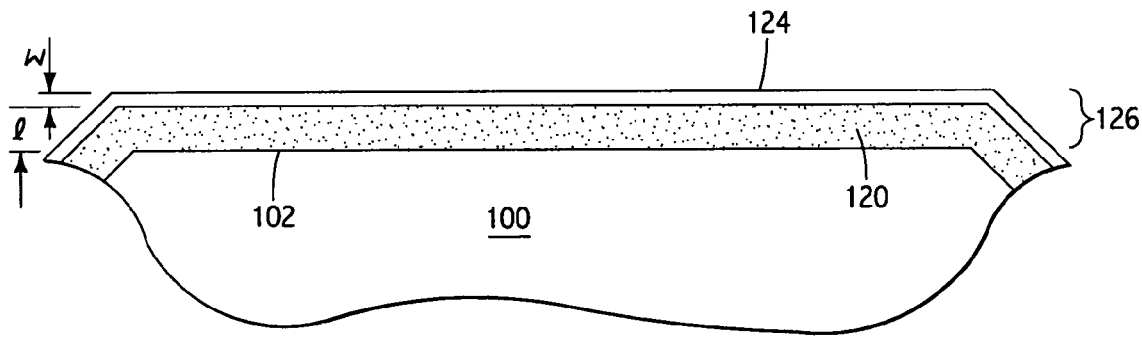
FIG. 4 is a second view showing the resulting coating from the first and second deposition steps.
Figure 5:
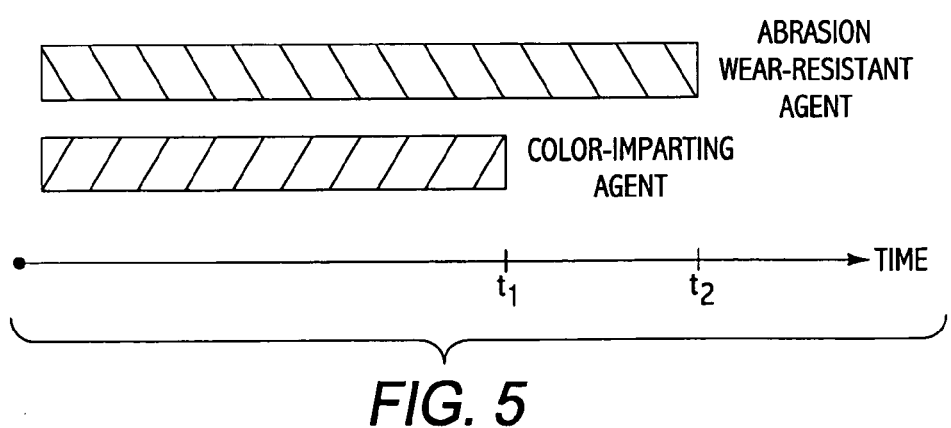
FIG. 5 is a timeline showing the deposition of the various materials over time.

FIGS. 3-5 illustrate this alternate embodiment for further applying a wear-resistant layer, without co-deposited coloring agent, over the top of first layer 120. The further abrasion wear-resistant agent application is accomplished in block 122, shown in FIG. 3 as a DLC or CVDD application over the top of first layer 120. This results in a second layer 124 of thickness w being deposited over the top of first layer (e.g. underlayer) 120 as shown in FIG. 4. It is understood that both layers form an integrated film 126 having a lower portion (e.g. first layer 120) immediate the gemstone surface having a first property and an upper portion (e.g. second layer 124) spaced from the gemstone surface having a second property. In the embodiment shown in FIGS. 3-5, for instance, the first property has both colorant and wear-resistant properties which the second property is simple a wear-resistant property and does not include the colorant.

The preferred thickness of the co-deposited underlayer is between about 5 Å to 2 microns and the top DLC or CVDD-only layer is preferably between about 50 Å to hundreds of angstroms (if an optically transparent DLC or CVDD layer is desired). The thickness of the deposition layer applied is based upon time of application using derived values of thickness achieved for time of application.

In FIG. 5, for instance, the method for imparting a wear-resistant color layer to a gemstone surface comprises concurrently codepositing on the gemstone surface a color imparting agent with an abrasion wear resistant agent until a time $t_1$ to form a wear resistant color matrix, and then continuing only the deposition of the abrasion wear resistant agent over the top surface of the wear resistant color matrix until time $t_2$.

The abrasion wear resistant only layer 124 is generally optically transparent at the thicknesses w deposited. An optically transparent layer is capable of transmitting the range of visible wavelengths from 400 nm to 700 nm thus causing the layer to appear highly transparent and devoid of any color. Appearance of color or opacity in a thin film is a function of its thickness, refractive index, bulk absorption properties thus each material will have a particular thickness range in which it appears optically transparent and for thickness beyond certain value will start to show appearance of color or opacity.

To achieve colorization via interference or bulk absorption using abrasive-resistant coatings, oxides (e.g. $SiO_2$, $TiO_2$, $Al_2O_3$, $V_2O_3$, $Fe_2O_3$, $Cr_2O_3$, NiO, $Ta_2O_5$ etc.) nitrides (e.g. $TiN_x$, ZrN, TaN), alloys (Au/Ag/Cu etc) and composites (e.g. TiZrN, TiCN, $TiC_xN_y$, $ZrC_xN_y$ etc) of metals, non-metals, semiconductors at various thicknesses may be deposited in conjunction with DLC or CVDD deposition. Deposition of such materials can be made using a combination of magnetron deposition and ion beam deposition processes. Examples of color impartation are as follows:

(1) An integrated layer, e.g. diamond film, of total thickness 1680 Å of which 1400 Å is a non-stoichiometric oxide Cr layer deposited on the pavilion of a topaz. This produces a brilliant amber color with secondary green color effects in an abrasion resistant diamond film;

(2) The deposition of a DLC layer with less than a few percent of Si to a thickness of approximately 50 Å produces a yellow color on colorless topaz;

(3) Varying levels of Au are co-deposited with DLC to produce colors in the light greens, and golds to amber shades.

In the case of alloys and composites, the bulk absorption that is responsible for coloration is influenced by both the structure and the composition of the dispersed impurity ion or metallic particle. Rare-earth hexaboride (e.g. $LaB_6$, $CeB_6$, $YB_6$, $SmB_6$) coatings can exhibit colors ranging from purples to reds—these can also be used as the sub-layer that imparts color.

The above methods may also be coupled with alumina or polymer-based materials or nitride/carbonitrides instead of DLC or CVDD depositions.

An abrasion wear resistant coating of optically clear DLC (or H-DLC) or CVDD can be deposited on naturally colored gemstones including but not limited to emerald, ruby, sapphire, etc. to provide them with superior scratch resistance. The DLC or CVDD coating may contain less than a few percent of certain elements that improve the abrasion wear resistance and induce hydrophobicity, as mentioned elsewhere in this disclosure.

The proprietary aspect of the above mention treatments is having a single process wherein a portion of the abrasion wear resistant coating (or sub-layer) contains the color inducing agent. Coatings of metals/metal oxides or coatings of DLC or CVDD on various substrates have been described in literature separately. The novel concept of providing an integrated coating enables the selection of a wide range of materials including those that do not adhere to the substrate materials when used alone. An excellent example is the novel concept of sputtering noble metals such as gold on topaz. Gold when sputtered on topaz does not adhere to the topaz surface since the deposition is physical in nature and there is no chemical binding between the gold and the topaz material. There are numerous metals, oxides, alloys, composite materials which may not adhere to the substrate material when deposited as a film of that material.

When these same materials are incorporated into the DLC or CVDD abrasion wear resistant film deposition, the issue of non-adherence of these materials to the substrate no longer applies. The reverse of this is also true. That is, because the deposition of abrasion wear resistant DLC or CVDD film is not possible on some materials such as noble metals, the addition of certain elements during a co-deposition process would aid in the formation of an adherent layer. Additionally, the integrated abrasion wear resistant color deposition has better mechanical properties as compared to multi-layer coatings.

The disadvantages of multi-layer coatings are many. In addition to being complex and time consuming to apply, the presence of interfaces between films narrows the choice of layers that can be deposited over one another. The thermal-mechanical properties of films in adjacent layers must be matched in order to manage the thin film stresses built into the multilayer coating. For example, a multi-layer coating of film A over film B would need to be such that if film A deposited over substrate X is tensile in nature then film B would need to be compressive in nature. Such an arrangement is necessary in order to nullify the thin film stress that can lead to cracking, peeling, flaking, etc.

Applicants are aware of no prior art that describes an integrated process step as described above. To date an apparatus integrated to perform plasma-assisted deposition, magnetron deposition and ion beam-assisted deposition in one unit, each of which can be independently controlled to operate at the same time, has not been commercially sold.

Figure 6:
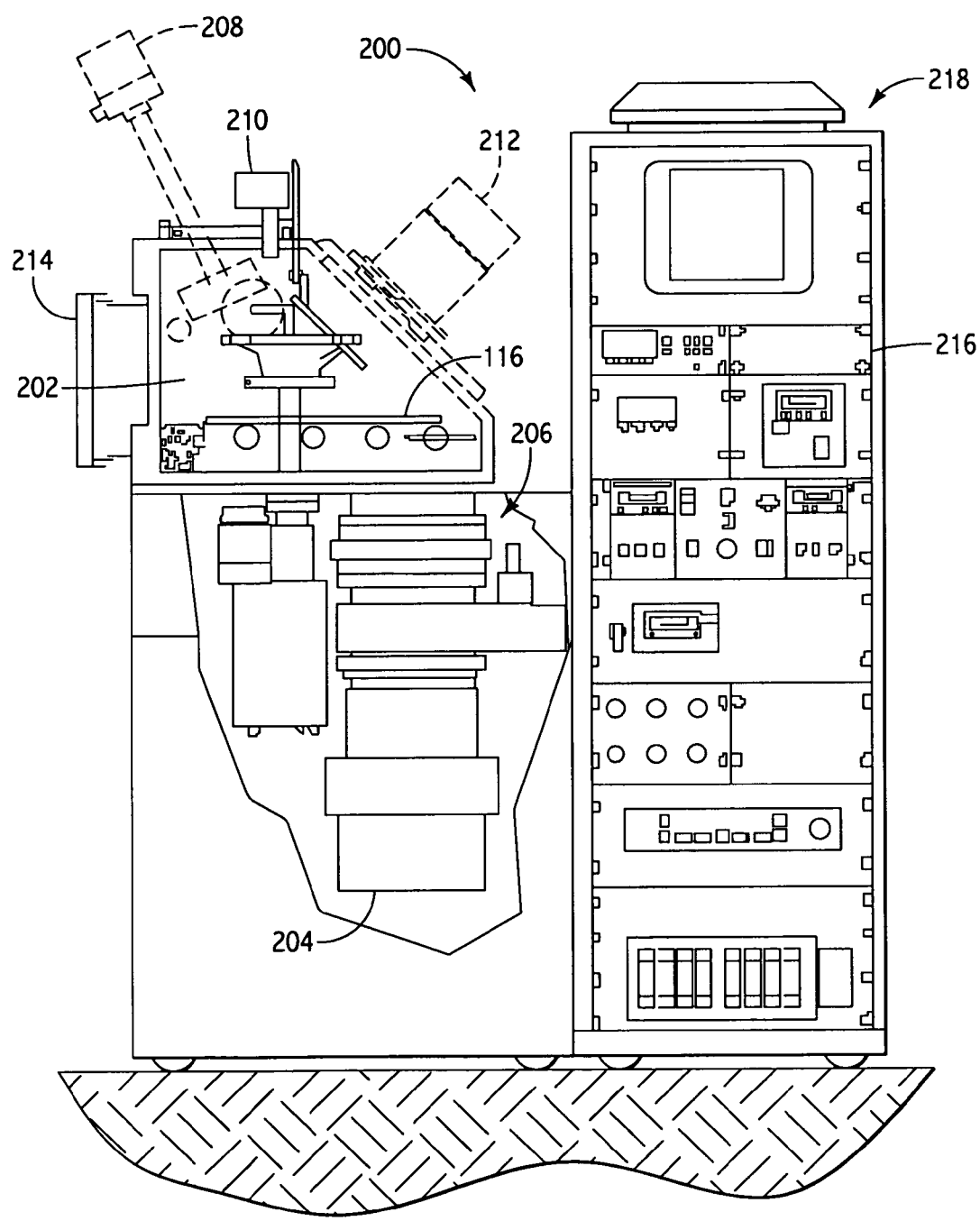
FIG. 6 is a line drawing illustrating the IAD/MAF/RF etch deposition system configuration

FIG. 6 shows a line drawing of an integrated IAD/MAG/RF etch/deposition system 200 that can perform such an integrated process step. The process takes place in a deposition chamber 202, using a deposition chamber pumping system 204 shunting gas through a vacuum gauging/process gas flow control system 206. Three deposition methods are used to individually or simultaneously deposit material onto a substrate such as a cut gem mounted on the sample stage 116 within the chamber. These three deposition methods include a magnetron sputtering head 208, an RF source 210, and an ion beam CD source 212, all focused toward the sample stage. In the embodiment shown, the magnetron source and ion beam source are focused at oblique angles to the stage 116 with the RF source mounted between them and focused straight down toward the sample stage. Elements of the IAD/MAG/RF deposition system as shown in FIG. 6 are described in more detail below.

The deposition chamber 202 is characterized, in a preferred embodiment, with a 304 L stainless-steel chamber, measuring approximately 18" inside (diameter)×14.50" high; yielding 7" substrate to ion source distance. There are three major penetrations on top/side with one for Diamonex ion beam source for DLC deposition at a 45° angle to the stage 116. The chamber 202 includes an additional plate for holding an ion source in a 28.5° position relative to the stage. Another penetration through chamber 202 is used for the ISO 160 flange for the sputtering source. The third penetration 214 is a 10" ID CF blanked off for future addition of load lock. Chamber 202 further includes a large profile, front-loading door, approximately 15" high×18" wide; with a 4" viewport and a bottom-mounted pumping plenum with ISO 200 flange.

The deposition chamber pumping system 204 includes, in a preferred embodiment, a 1450 lps corrosive series rated turbo pump, a 27 cfm Alcatel mechanical pump, and a 8" motor driven throttling gate valve.

The vacuum gauging/process gas flow control system 206 includes a full range transmitting vacuum gauge, and a ceramic capacitance manometer interfaced to the system controller.

The RF bias able substrate state includes a RF-Bias substrate stage (confocal source mode), a pre-machined sample transfer platen (nominal 150 mm diameter), a high performance, RF-biasable rotary motion feed through with 3.38" CF flanging, a direct-drive, compact, gear motor, and a speed adjust (0-20 rpm) via front panel potentiometer.

The RF bias able substrate stage power supply 216 includes a 2000 W RF power supply coupled to an automatic match network, hardwired safety interlock (chamber door, vacuum bellows safety switch, and cathode water), and twin power output lead from match network to minimize cable heating.

The sputtering unit 208 includes a 3" stalk-mounted, flex, magnetron sputtering cathode, and a 600 W RF power supply in equipment stack 218 with auto-match network.

The process gas is 4 each, MFC's where the gases are intended for sputtering, biased stage, and future addition of for ion source.

System control and automation within equipment stack 218 include programmable logic controller (PLC) with membrane-type operator interface, EEPROM memory backup, with valve control/sequencing, pump operation, and system interlocks controlled by the PLC. The following operating modes are available: (1) AUTOPUMP (automatic load-lock and chamber pumpdown to high vacuum conditions), (2) AUTOVENT (automatic load-lock and chamber venting to atmospheric pressure), (3) MANUAL (permits manual (front panel) system operation and interruption of in-process automatic system sequences), and (4) MAINTENANCE MODE (key-switch selectable from MANUAL mode; permits all MANUAL MODE functionality, "soft" system valve interlocks disabled. All "hard" safety interlocks remain operational).

Preferred utilities requirements include the following:
Electrical: 208 VAC, 60 Hz, 3-phase, 5-wire, 60 A (Nominally, exact power requirement supplied at time of order);
Cooling water: 10-15 l/min, 15-25 degrees Centigrade, 3-4 bar differential between supply and return (6 bar maximum inlet pressure);
Compressed air: 10-20 l/hr, normal dry shop air, 6-7 bar (system valve operation);
Nitrogen: (preferentially evaporated from liquid N2), 0.5 bar (chamber venting, 100 l/cycle, optional), and 0.5 bar (load-lock venting, 10 l/cycle, optional); and
Process Gases: 5N purity, 0.5 bar Claims are made to the unique processes that will utilize a combination of deposition processes running independently and/or simultaneously to achieve the desired properties in the deposited film.

B) Metal Jewelry

Providing abrasion wear resistance to finished metal jewelry provides a particular problem. Deposited DLC or CVDD coatings would provide the required abrasion wear resistance, but these cannot be deposited on noble metals since a carbide interface for adhesion cannot be formed. The invention therefore contemplates depositing a first ultra-thin adherent interlayer of a composite coating such as alloy nitrides (such as AlTiN) or oxides or other similar materials, which do not in any way change the appearance of the jewelry item, followed with an ultra-thin layer of DLC or CVDD deposition to provide abrasion wear resistance. The choice of first interlayer is based upon the adhesive property to the metal (e.g. gold or platinum) jewelry item as well its ability to serve as a base layer for DLC or CVDD deposition. Alternatively, the deposited DLC or CVDD coating may have incorporated in it an element that can serve as an adhesion promoter for DLC or CVDD on the metal item. Metal jewelry referred to here includes but is not limited to gold, platinum, rhodium, titanium, tungsten, and silver materials. Jewelry may take any form of decorative ornament including but not limited to rings, watch straps, bracelets, chains, pins, cuff links, etc.

C) Watch Dials

Current methods of producing watch dials is through the use of metals or other materials that may contain applied paint coatings or treatments such as anodizing. The present invention contemplates achieving various decorative effects by treating watch dials and sub-dials as noted above in connection with gemstones. That is, a >1 micron coating of DLC/CVDD is deposited on thin polished metal to create a unique surface that appears jet black in addition to producing brilliant shine. The coating thickness and substrate material may also be varied to impart other colors. Additionally deposited coating of diamond may contain other elements as described in the treatment of gemstones to produces a range of colors. The watch dials and sub-dials may also be made of free standing diamond wafers instead of diamond films deposited on metals or other materials. The watch dial may also be fabricated using polished SiC material.

Additionally, the above technique may be employed on the watch face cover which is typically made of mineral, synthetic sapphire, plastic or acrylic material. The sapphire crystal is the most durable due its superior hardness (Rockwell 9) but it is also more expensive. A plastic substrate on which a suitable thickness of a modified DLC or CVDD film is deposited provides equal or greater abrasion wear resistance than sapphire at a cost that would be less than providing a sapphire crystal for the watch face cover.

III. Sub-Surface Implantation Methods

A. Diamonds and Gemstones

Color may be imparted to diamonds and gemstones via implantation of impurities using a gas cluster ion beam (GCIB) apparatus as first disclosed in U.S. patent application Ser. No. 10/245,863 whose contents are incorporated herein for all purposes. In the case of diamonds, the impurities may include but not be limited to boron, nitrogen, phosphorus, sodium, sulfur, lithium, etc. This apparatus can be used for sub-surface implantation of impurities to create a color based on type of impurity. Additionally other broad beam implanters can also be used for implantation of impurities. Patents on the incorporation of impurities into diamond during its synthesis have been discussed but there are no inventions detailing a method where GCIB processing is used for introducing the impurity into the diamond or gemstone. A gemstone that is colorized by implantation process can be further treated with DLC or CVDD coating to impart abrasion wear resistance.

The impact morphology and kinetics of an atomic or molecular cluster ion impinging on a surface is quite different from that of monomer ions composing a broad or focused ion beam impinging upon a target. Formed in vacuum through a Venturi nozzle, van der Waals forces may hold anywhere from 500 to 5,000 atoms of a source gas together. Ionizing the gas cluster provides a given cluster of atoms with a single shared charge. With 5-80 kV acceleration to a target surface, the energy of acceleration of the cluster upon surface impingement is divided between all the atoms of the cluster. With this division of energy, an individual atom belonging to the cluster that accelerated through 5-80 kV imparts an equivalent energy of that of a monomer ion accelerated through a few eV.

Figure 7:
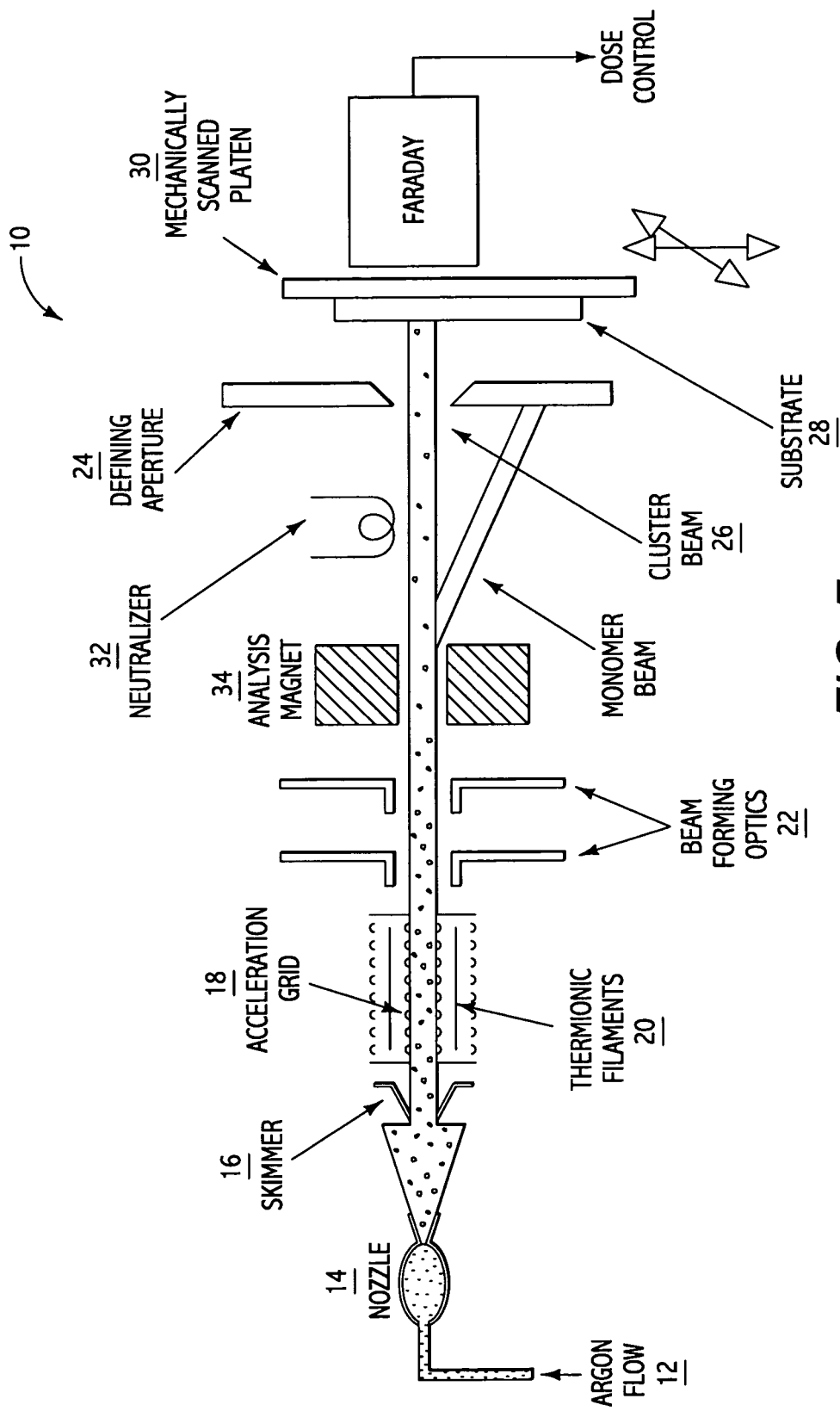
FIG. 7 is schematic diagram of a gas cluster ion beam (GCIB) apparatus where the source gas is forced through a nozzle at high pressure to form atomic or molecular clusters.

FIG. 7 shows a GCIB device capable of implementing this feature, with operation of this method shown in the illustration of FIG. 8.

The impact morphology and kinetics of an atomic or molecular cluster ion impinging on a surface has been found to be quite different from that of monomer ions composing a broad or focused ion beam impinging upon a target. Formed in vacuum through a Venturi nozzle (FIG. 7), van der Waals forces may hold anywhere from 500 to 5,000 atoms of a source gas together. Ionizing the gas cluster provides a given cluster of atoms with a single shared charge. With 5-80 keV acceleration to a target surface, the energy of acceleration of the cluster upon surface impingement is divided between all the atoms of the cluster. With this division of energy, an individual atom belonging to the cluster that accelerated through 5-80 keV imparts an equivalent energy of that of a monomer ion accelerated through a few eV.

The general GCIB apparatus schematic is shown in FIG. 7 at 10. The apparatus comprises a source of gas characterized by argon flow 12 passing through Venturi nozzle 14. A skimmer 16 is positioned in front of nozzle 14 to admit therethrough only clusters moving linearly in the same direction. The linearized cluster stream is then passed through an acceleration grid 18 including thermionic filaments 20 where an acceleration energy is imparted to the stream and, together with optics 22 and defining aperture 24, form an gas cluster ionized beam 26. The substrate 28 is mounted on a platen 30 (or a gemstone within a holder) within the impact path of beam 26. An analysis magnet 34 and neutralizer 32 co-act to filter out undesired monomer beams formed through the process by redirecting them for impact against defining aperture 24 so that such monomer beams and particles do not impact substrate 28 and negatively affect the morphology thereby.

The FARADAY cup as it is termed is a device used to measure the beam current which is then used to calculate the dose. This measurement is performed by moving aside the sample platen and allowing the beam to pass through the defining aperture and impinge upon the faraday cup. The beam current registered by the Faraday cup is used to calculate the dose being delivered by the beam using the following relationship:

Dose "D"=(Ixt)/qA, where

I=beam current registered by faraday cup {I is in ampere which is the SI base unit of electrical current and is equal to coulombs per second} t=Dwell time of the beam $q=1.6 \times 10^{-19}$C {C=coulomb which is the unt of charge}

A=area

Figure 8A:
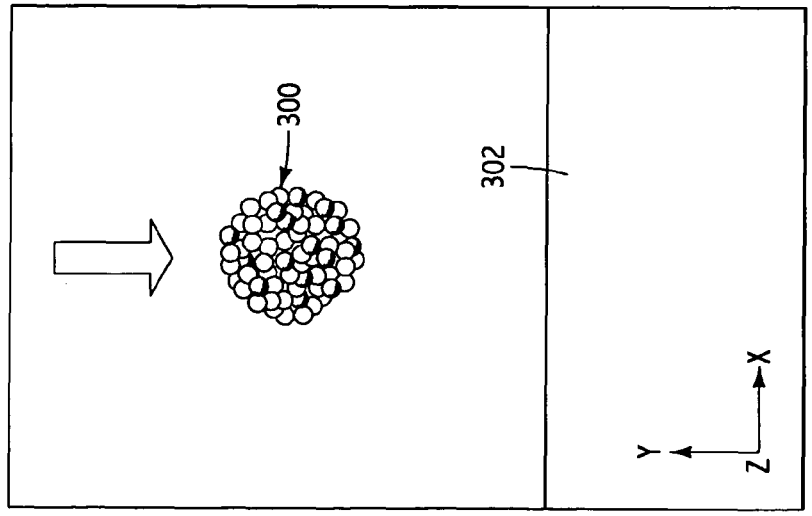
FIG. 8 is an illustration of the sub-surface implantation process via the GCIB apparatus of FIG. 7.
Figure 8B:
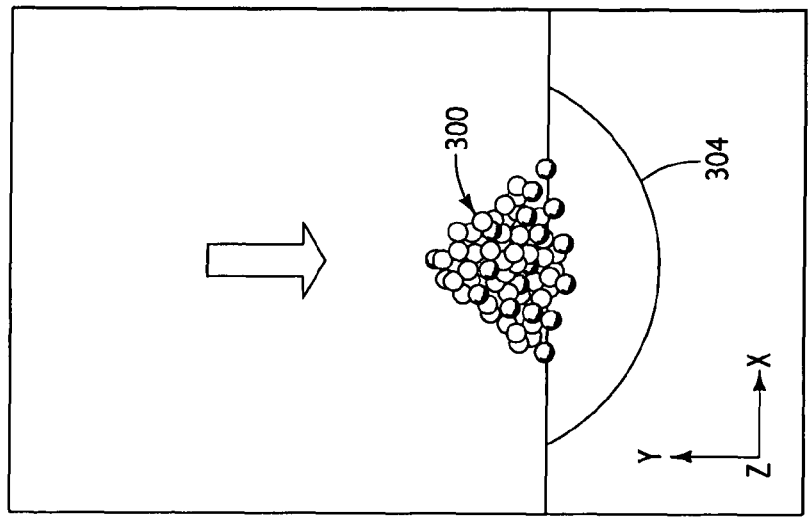
Figure 8C:
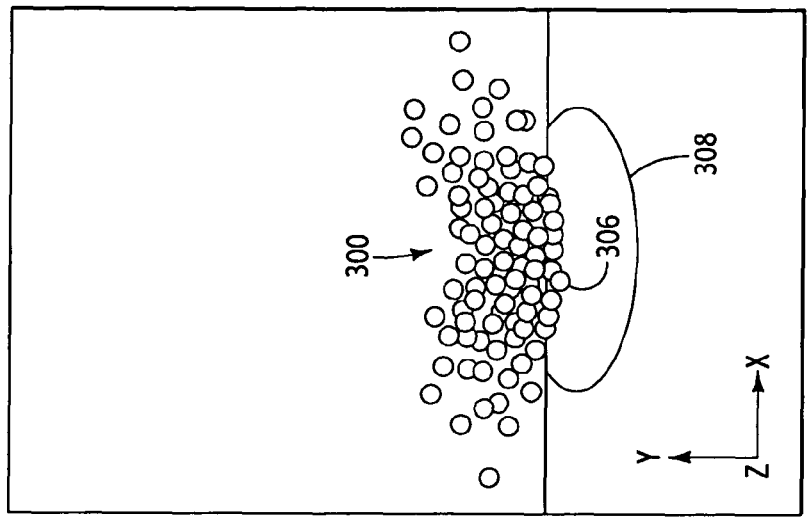

FIGS. 8A-8C illustrate the impact mechanism of ionized clusters upon solid surfaces. Such impacts all their energy to an extremely shallow region of the surface, and the cluster breaks apart. In FIG. 8A, gas cluster ions 300 formed using the device of FIG. 7 are accelerated toward a material surface 302 through potentials of a few thousand volts. In FIG. 8B, the gas cluster ion 300 impacts the surface 302 and transfers its energy into a volume 304 on the surface. Finally, in FIG. 8C, at the instant of contact with the cluster 300, the solids (e.g. particle 306) are infused into this heated/pressurized zone 308.

The ability of ionized clusters to bring energy and high reactivity rates to the upper most layers of atoms on a surface can be harnessed to achieve precise sub-surface doping of impurities. The cluster transfers its energy into a volume on the surface. The energy propagates in three dimensions and is quickly quenched, creating an intense transient thermal (and pressure) spike (TTS). At the instant of contact with the cluster, the solids incorporated in the cluster are infused into this heated/pressurized zone. The infusion doping depth is related to the beam energy to the 1/3 power. But since the cluster energy is shared among the constituent atoms, each atom has only a few eV of energy and so channeling is not possible.

IV. Sol Gel Methods

A) Gemstones, Diamonds, Crystals

Chemical coatings can be applied by sol gel techniques in which the process where a chemical reaction, e.g. the reduction of a metal is involved. Oxide coatings can be prepared in form of sols, following the alkoxide synthesis route. This is valid for sols from $SiO_2$, $TiO_2$, $ZrO_2$ or even $Al_2O_3$. Combinations of oxides with high and low reflective indexes (e.g. $SiO_2$ and TiO2) can be used for the production of interference based color.

Subsequent to the sol gel method of color treatment, the gemstone would be subject to deposition of an optically transparent abrasion wear resistant film of DLC or CVDD or nitride/carbonitrides. In some cases a sol gel technique for application of $Al_2O_3$ may be employed for achieving a hard coating.

A brief description of the various sol gel coating techniques:

1. Dip Coating

Dip coating techniques can be described as a process where the substrate to be coated is immersed in a liquid and then withdrawn with a well-defined withdrawal speed under controlled temperature and atmospheric conditions. The coating thickness is mainly defined by the withdrawal speed, by the solid content, and by the viscosity of the liquid. If the withdrawal speed is chosen such that the sheer rates keep the system in the Newtonian regime, the coating thickness can be calculated by the Landau-Levich equation [1] (eq 1).

$$h = 0.94 \cdot \frac{(\eta \cdot v)^{2/3}}{\gamma_{LV}^{1/6}(\rho \cdot g)^{1/2}}, \quad (1)$$

using:

h=coating thickness h=viscosity
$g_{LV}$=liquid-vapor surface tension r=density
g=gravity By choosing an appropriate viscosity, the coating thickness can be varied with high precision from 20 nm up to 50 μm while maintaining high optical quality. If reactive systems are chosen for coatings, as it is in the case of sol-gel type of coatings using alkoxides or pre-hydrolyzed systems (the so-called sols), the control of the atmosphere is indispensable. The atmosphere controls the evaporation of the solvent, and the subsequent destabilization of the sols by solvent evaporation, leads to a gelation process and the formation of a transparent film due to the small particle size in the sols (nm range).

2. Angle-Dependent Coating

An angle dependent coating process may be employed to obtain coating thickness that is dependent on the angle between the substrate and the liquid. An angle dependent coating would naturally occur as a result of the faceting present on the stone which would lead to an interesting method of color creation using single optically transparent layers.

3. Spray Coating

Processes similar to spray coating, where very fine droplets are produced (atomizers) like the pyrosol-process, in general lead to very homogeneous coatings on hard substrates. These coating materials do not, however, hit the surface of the object to be coated in the form of liquid droplets. Instead, they more or less form dried small particles in the nanometer range. This process can be also employed to apply a homogeneous film over gemstones.

4. Laminar Flow Coating

The so-called capillary or laminar flow coating process has been developed by Floch which combines the high optical quality of the dip coating process with the advantage that all the coating liquid can be exploited.

B) Watch Dials

The spin coating process of sol gel may be used for imparting specific colors based upon the sol used. Subsequent to sol gel coating and curing process the dial is subject to DLC or CVDD film deposition.

V. Hydrophobic Coatings:

Another application of sol gel technique is the method of imparting hydrophobicity to the gemstone surface. Hydrophobic, water repellent or easy-to-clean coatings have been developed by wet chemical processes, since these coatings in general have to be multifunctional coatings.

One embodiment is where sol-gel derived $ZrO_2$ is deposited on the substrate is by dip coating and treated at low temperatures to micro- or nanoporous layers. These layers then are impregnated by perfluorinated silanes. Embedded in the zirconia network, the perfluorinated sidechains show a high thermostability and "survive" the bending process. These coatings show a permanent hydrophobicity and dust repellence. Another type of hydrophobic coatings has been developed by PPG. These coatings are mainly based on organic polymers and can be employed by dip—or very special spray coating techniques. Another type of hydrophobic fluorinated coating has been developed by Kasemann, et. al. This coating is based on colloidal silica, surface modified by methyl groups and compounded with a sol, prepared from fluorinated organoalkoxy silanes. After employing on the substrate, this coating undergoes a self-alignment, in which the fluorinated groups turn to the air side of the coating and the reactive silanes to the glass substrate to perform adhesion. The coating is stable for temperatures up to 400° C.

VI. Adaptation Of Gemstone Cutting And Faceting Specific To The Color Effect Desired From The Abrasion Wear Resistant Color Treatment The cut of the stone plays a very significant role in the color effect that is obtained after any of the above abrasion wear resistant color treatments that result in dual- or multi-colored stones. The cut styles and faceting of gemstones are many and varied. Refer to FIG. 1 for an illustration of the various features on a cut gemstone, including star facets 130 located on the crown 104 adjacent the table 102, main facets 132, and girdle facets 134 located on the crown adjacent the girdle 106. Facets cut into the pavilion 108 of gemstone 100 include the pavilion girdle facets 136 and the pavilion main facets 138. The culet angle, the pavilion height, faceting on the crown, symmetry, number of facets, ratio of length of upper girdle facet to the lower girdle facets, faceting of the crown, concave faceting versus conventional plane faceting all play a important role in the reflection and dispersion o the light. The color appearance of a gemstone treated with abrasion resistant color that is designed for the production of a multi-colored stone will show particular zones for the appearance of the secondary and tertiary colors. Additionally the secondary and tertiary color itself is closely linked to the cut of the gemstone in conjunction with the design of the abrasion wear resistant color film. In certain cases the appearance of a tertiary color is closely linked to the cut of the gemstone.

VII. Method For Providing Decoration In The Form Of Symbols, Characters, Pictures That Are Applied On The Table Of The Gemstone And Protected Within An Abrasion Wear Resistant Layer Decoration of metal jewelry in the form of carvings of symbols, characters or pictures have been practiced through all ages and more recently methods for marking on diamonds for the purpose of identification and tracking or for the purpose of branding have become prevalent. Branding of gemstones as a means for display of symbols, characters or pictures on the table of the gemstone itself is not currently practiced in any form. Methods that can be used to embed a brand on the table of a gemstone and protect it with an abrasion wear resistant layer are described here:

A. Blanket deposition of metal and patterning process—
1. Perform pre-clean step using UV/ozone cleaning to ensure that the gemstone is free of organic contamination.
2. Load in IAD/MAG/RF system with crown of the gemstone facing up and perform a blanket deposition of a metal such as Chromium, Titanium, or any other metal.
3. Deposit a coating of commercially available negative photoresist such as Kodak's KTFR or DuPont's "dry-film resist" or any other commercially available negative resist.
4. Align a mask containing the image of the symbol(s), character(s) or picture and expose the substrate followed by developing in standard developer. It is not necessary to explain in detail the procedure for application of the photoresist and exposure and developing process as this is known to a person skilled in the art. The substrate now will have resist covering the region in the shape of the symbol, character or picture transferred from the mask.
5. The regions of metal that is exposed after removal of the resist in the unexposed areas is etched away using standard metal etching.
6. The residual resist is finally removed by immersion in solvent such as acetone.
7. The gemstone is cleaned in UV/ozone cleaner and loaded into IAD/MAG/RF system. An abrasion wear resistant layer is deposited over the crown of the gemstone thus protecting and embedding the brand on the gemstone table.

B. Blanket deposition of resist and patterning process:
1. Perform pre-clean step using UV/ozone cleaner
2. Apply coating of commercially available positive photoresist such as Shipley Microposit S1813 over the crown of gemstone.
3. Expose the resist through the mask containing the exact copy of the pattern to be created on the gemstone. Alternatively the resist can be removed in the shape of the pattern to be transferred to the gemstone via the use of a laser or focused charged particle beam marking system.
4. Perform standard developing process to dissolve the exposed portion of the resist. If a laser removal of resist is done then a developing process is not required.
5. Load in IAD/MAG/RF system and perform blanket deposition of desired metal. The exposed areas of the gemstone and the portions covered by resist receive a thin layer of the metal.
6. Perform standard lit-off of the resist by immersing in solvent such as acetone.
7. Perform pre-clean in UV/ozone cleaner and load in IAD/MAG/RF system and deposit specified thickness of abrasion wear resistant layer over the crown of the gemstone thus embedding the brand on the gemstone table.

Notes: There are two types of photoresist: positive and negative. For positive resists, the resist is exposed with UV light wherever the underlying material is to be removed. In these resists, exposure to the UV light changes the chemical structure of the resist so that it becomes more soluble in the developer. The exposed resist is then washed away by the developer solution, leaving windows of the bare underlying material. In other words, "whatever shows, goes." The mask, therefore, contains an exact copy of the pattern which is to remain on the wafer.

Negative resists behave in just the opposite manner. Exposure to the UV light causes the negative resist to become polymerized, and more difficult to dissolve. Therefore, the negative resist remains on the surface wherever it is exposed, and the developer solution removes only the unexposed portions. Masks used for negative photoresists, therefore, contain the inverse (or photographic "negative") of the pattern to be transferred. The figure below shows the pattern differences generated from the use of positive and negative resist.

VIII. Process Flow

A. Method To Produce Abrasion Wear Resistant Color On Gemstone (Or Pearls)—IAD/MAG/RF Apparatus
1. Perform pre-clean step using UV/ozone cleaning to ensure that the gemstone is free of organic contamination (the capability of UV light to decompose organic molecules is well known and cleaners are now available commercially from various manufacturers).
2. Load in IAD/MAG/RF system—perform co-deposition of color imparting agent and abrasion wear resistance imparting agent to specified thickness on crown side and pavilion side or crown side only or pavilion side only. After specified thickness is reached switch off the process that is used for deposition of color imparting agent and continue with deposition of abrasion wear resistance agent for a specified thickness.
3. Perform post-clean with UV/ozone cleaner
4. Perform hydrophobic coat using sol gel or vapor deposition process technique—optional (Hydrophobicity may be imparted in some cases by incorporating elements such as F or B into the DLC or CVDD film during deposition)

B. Method To Protect Treatments Provided To Natural Gems And Improve Surface Mechanical Properties Of Soft Gems—Iad/Mag/Rf Or Gcib Apparatus
1. Perform pre-clean step using UV/ozone cleaning to ensure that the gemstone is free of organic contamination
2. Load in IAD/MAG/RF system—perform deposition of DLC or CVDD to a specified thickness in order to obtain a highly adherent colorless abrasion wear resistant hydrophobic (by incorporating elements that impart this property) layer.
3. Perform post clean with UV/ozone cleaner.

The above treatment using a DLC or CVDD coating provides protection from irradiated gemstones. Typically topaz is irradiated to produce colors such as the well known "swiss blue" or "London blue" varieties. Such stones require long period of sealed storage before their radioactivity is pronounced to be at safe levels for exposure to environment and the wearer. Despite these safety precautions there is a perception in the public mind that irradiated gems are not completely free of some level of radioactivity. This perception has created demand for other types of treatments such as diffusion treatments to achieve same or similar color effects as seen in irradiated gemstones. By utilizing the above process method wherein a clear DLC or CVDD layer is deposited on all surfaces of an irradiated gemstone the possibility of exposure to any small level of radioactivity is completely removed since diamond acts as an excellent barrier to such radiation.

Another example of how the DLC or CVDD coating provides protection to treatments given to enhance natural gemstones is in the case of emeralds. Emeralds owe their appearance to oiling treatments that are known to improve the color and luster of the gem. Such treatments are not permanent and may need to be treated from time to time. Application of a DLC or CVDD coating to encapsulate the emerald serves to protect the treatment in addition to providing for improved mechanical properties of the surface. Other examples of application of DLC or CVDD coatings of specific thickness on all surfaces of cut gemstones that have low hardness include but are not limited to stones such as Apatite, Chrome Diopside etc.

C. Method To Protect Treatments Provided To Natural Gems And Improve Surface Mechanical Properties Of Soft Gems—Sol Gel Process
1. Perform pre-clean step using UV/ozone cleaning to ensure that the gemstone is free of organic contamination
2. Perform sol gel process to encapsulate the gemstone using materials such as alumina which provide an abrasion wear resistant layer
3. Perform post clean with UV/ozone cleaner.

D. Method To Produce Abrasion Wear Resistant Color On Gemstone (Or Pearls)—Sol Gel Treatment And Deposition
1. Perform pre-clean step using UV/ozone cleaning to ensure that the gemstone is free of organic contamination
2. Perform sol gel process to apply a coating of color imparting agent (interference based or bulk absorption based color production).
3. Perform high temperature or UV curing process as required.
4. Load in IAD/MAG/RF system—perform deposition of abrasion wear resistant film to specified thickness. Abrasion wear resistance may be also imparted via sol gel process of coating alumina layer.
5. Perform post clean with UV/ozone cleaner
6. Perform hydrophobic coat using sol gel or vacuum deposition technique—optional (Hydrophobicity may be imparted in some cases by incorporating elements such as F or B into the DLC or CVDD film during deposition).

E. Method To Produce Abrasion Wear Resistant Color On Gemstone—Implantation And Deposition
1. Perform pre-clean step using UV/ozone cleaning to ensure that the gemstone is free of organic contamination
2. Load in GCIB apparatus or broad beam ion implanter and perform implantation of desired species introduced into the gemstone at specific energy and dose.
3. Load in GCIB or IAD/MAG/RF system and deposit an abrasion resistant layer with or without color component with.
4. Perform post clean with UV/ozone cleaner F. Method To Improve Color Characteristics Of A Colored Gemstone And/Or To Add Secondary/Tertiary Color Effects (Natural Or Synthetic)
1. Perform pre-clean step using UV/ozone cleaning to ensure that the gemstone is free of organic contamination
2. Perform sol gel based color treatment or deposition of an abrasion wear resistant film with appropriate color component or a combination o these 2 processes such that the treated gemstone exhibits improved color saturation, perceived color, color characteristics, color effects and/or brilliance
3. Perform post clean with UV/ozone cleaner.

G. Method To Improve Abrasion Wear Resistance Of Soft Natural And Synthetic Gemstone (E.G. Emeralds, Apatite, Chrome Diopside Etc)
1. Perform pre-clean step using UV/ozone cleaning to ensure that the gemstone is free of organic contaminants.
2. Load in IAD/MAG/RF system and deposit specified thickness of DLC or CVDD to impart a clear abrasion wear resistant coating that does not change the color characteristics of the gemstone or perform sol gel based treatment to impart an abrasion wear resistance layer that does not change the color characteristics of the gemstone.
3. Perform post clean with UV/ozone cleaner.

H. Method To Produce Abrasion Wear Resistance On Metal Jewelry—IAD/MAG/RF Or Sol Gel
1. Perform pre-clean step using UV/ozone cleaning to ensure that the gemstone is free of organic contamination
2. Load in IAD/MAG/RF system and perform deposition of appropriate sub-layer to promote adhesion of abrasion wear resistant layer. The interlayer must be adherent to the metal jewelry surface. The adhesion promoting layer may also be co-deposited along with abrasion wear resistant layer deposition.
3a. Deposit specified thickness of abrasion wear resistant film on the sub-layer.
3b. Alternately, perform sol gel process to deposit abrasion wear resistant layer with appropriate adhesion promotion layer.
4. Perform post clean with UV/ozone cleaner I. Method To Produce Diamond Watch Dial Or Watch Face Cover
1. Perform pre-clean step using UV/ozone cleaning to ensure that the substrate (polished disk or other shape of metal such as titanium etc for dial and plastic disk or other shape for fabrication of watch face cover) is free of organic contamination
2. Load substrate material in the IAD/MAG/RF system
3. Perform DLC or CVDD deposition >1 micron to produce black diamond
4. Perform post clean with UV/ozone cleaner —or—

1. Perform pre-clean step using UV/ozone cleaning to ensure that the substrate (any sacrificial base material that can be etched off) is free of organic contamination
2. Load substrate material in the IAD/MAG/RF system
3. Perform DLC or CVDD deposition to a thickness that enables production of a free standing diamond wafer by removal of the substrate using appropriate etch process.
4. Perform post clean with UV/ozone cleaner J. Method To Produce Diamond Watch Dial—Sol Gel
1. Perform sol gel process to apply color coating on disk or other shape of substrate material (quartz, metal etc)
2. Perform high temperature or UV curing
3. Perform sol gel process to apply alumina coating over the color coat
4. Perform high temperature or UV curing K. Method To Produce Multi-Color Effect According To A Specific Pattern In A Clear Or Colored Gemstone (Natural Or Synthetic) Using The IAD/MAG/RF System
1. Perform pre-clean step using UV/ozone cleaner
2. Apply coating of commercially available positive photoresist such as Shipley Microposit S 1813 over the entire crown of gemstone or entire pavilion of gemstone or both crown and pavilion. Alternatively the resist can be applied to specific facets or can be applied to a section of the via dip coating of resist.

3. Remove the resist over specific facets or section of gemstone using a laser or focused charged particle beam system. The gemstone is held in a fixture capable of rotation about 3 axes such that a particular facet surface can be held perpendicular to the cutting beam. This procedure is not necessary if the resist has been applied only to specific facets or section of the gemstone.
4. Load in IAD/MAG/RF system and perform co-deposition of first color imparting agent and abrasion wear resistance imparting agent to specified thickness on crown side and pavilion side or crown side only or pavilion side only. After specified thickness is reached switch off the process that is used for deposition of color imparting agent and continue with deposition of abrasion wear resistance agent for a specified thickness.
5. Perform standard lit-off of the resist from the facets that are still covered by immersing in solvent such as acetone.
6. Perform pre-clean in UV/ozone cleaner reapply resist to facets that have received the abrasion wear resistant color treatment.
7. Load in IAD/MAG/RF system and perform co-deposition of a second color imparting agent and abrasion wear resistance imparting agent to specified thickness on crown side and pavilion side or crown side only or pavilion side only. After specified thickness is reached switch off the process that is used for deposition of color imparting agent and continue with deposition of abrasion wear resistance agent for a specified thickness.
8. Remove resist from masked portions of gemstone by standard lift-off using a solvent such as acetone.
9. Perform post clean in the UV/ozone cleaner.
10. Perform a hydrophobic coat using sol gel or vacuum deposition technique—optional (Hydrophobicity may be imparted in some cases by incorporating elements such as F or B into the DLC or CVDD film during deposition).

L. Method To Produce Multi-Color Effect According To A Specific Pattern In A Clear Or Colored Gemstone (Natural Or Synthetic) Using The Sol Gel Process Alone Or In Combination With Iad/Mag/Rf System 1. Perform pre-clean step using UV/ozone cleaner
2. Apply coating of commercially available positive photoresist such as Shipley Microposit S1813 over the entire crown of gemstone or entire pavilion of gemstone or both crown and pavilion. Alternatively the resist can be applied to specific facets or can be applied to a section of the via dip coating of resist.
3. Remove the resist over specific facets or section of gemstone using a laser or focused charged particle beam system. The gemstone is held in a fixture capable of rotation about 3 axes such that a particular facet surface can be held perpendicular to the cutting beam. This procedure is not necessary if the resist has been applied only to specific facets or section of the gemstone.
4. Perform sol gel process to apply a coating of first color imparting agent (interference based or bulk absorption based color production).
5. Perform high temperature or UV curing process as required.
6. Perform standard lit-off of the resist from the facets that are still covered by immersing in solvent such as acetone.
7. Perform pre-clean in UV/ozone cleaner reapply resist to facets that have received the first sol gel color treatment.
8. Perform sol gel process on to impart a second color treatment to the gemstone. Alternatively load in IAD/MAG/RF system—perform deposition of an abrasion wear resistant color treatment
9. Remove resist from masked portions of gemstone by standard lift-off using a solvent such as acetone.
10. Perform post clean with UV/ozone cleaner
11. Perform application of abrasion wear resistant layer without color component over the crown side or pavilion side or both via the IAD/MG/RF system or via sol gel process.
12. Perform a hydrophobic coat using sol gel or vacuum deposition technique—optional (Hydrophobicity may be imparted in some cases by incorporating elements such as F or B into the DLC or CVDD film during deposition).

Having described and illustrated the principles of the invention in a preferred embodiment thereof, it should be apparent that the invention can be modified in arrangement and detail without departing from such principles. We claim all modifications and variation coming within the spirit and scope of the following claims.

What is claimed is:

1. A method for imparting a wear-resistant color layer to a gemstone surface, the method comprising:
concurrently codepositing via simultaneous vapor depositions of two or more species on the gemstone surface a color imparting agent using a first deposition module with an abrasion wear resistant agent using a second, independently controlled deposition module, to form a wear resistant color matrix.

2. The method of claim 1, further comprising the step of continuing only the deposition of the abrasion wear resistant agent over the top surface of the wear resistant color matrix.

3. The method of claim 1, wherein the abrasion wear resistant agent is selected from the group consisting of diamond-like carbon (DLC) and chemical vapor deposition diamond (CVDD).

4. The method of claim 3, wherein a thickness of the wear resistant color matrix is between about 5Å to 2 microns.

5. The method of claim 1, further comprising the step of continuing only the deposition of the abrasion wear resistant agent to form a wear layer over the top surface of the wear resistant color matrix wherein a thickness of the wear layer is between about 50Å to hundreds of angstroms.

6. The method of claim 1, wherein the color imparting agent is selected from the group consisting of Au, Pt, Cr, Fe, Si, and Ge.

7. The method of claim 1, wherein the color imparting agent is selected from the group consisting of oxides (e.g. $SiO_2$, $TiO_2$, $Al_2O_3$, $V_2O_3$, $Fe_2O_3$, $Cr_2O_3$, NiO, $Ta_2O_5$ etc.) nitrides (e.g. $TiN_x$, ZrN, TaN), alloys (Au/Ag/Cu etc) and composites (e.g. TiZrN, TiCN, $TiC_xN_y$, $ZrC_xN_y$ etc) of metals.

8. The method of claim 1, wherein the step of co-depositing the color imparting agent with the abrasion wear resistant agent includes magnetron deposition, RF or high density plasma deposition process, and ion beam deposition processes.

9. The method of claim 1, further including the step of applying a hydrophobic coat after the concurrently codepositing step.

10. The method of claim 9, wherein the step of applying a hydrophobic coat includes applying a sol gel.

11. The method of claim 10, wherein the step of applying the sol gel includes one selected from the group consisting of dip coating, angle-dependent coating, spray coating, laminar flow coating, spin coating, and capillary coating.

12. The method of claim 11, wherein sol gel used includes at least one of $SiO_2$, $TiO_2$, $ZrO_2$, and $Al_2O_3$.

13. The method of claim 9, wherein the step of applying a hydrophobic coat includes using a vapor deposition process.

14. The method of claim 1, further including the step of incorporating F, B, N, or Si into the wear resistant agent to impart hydrophobicity into the wear resistant color matrix.

15. The method of claim 1, wherein the step of co-depositing the color imparting agent with the abrasion wear resistant agent includes a sol gel process.

16. The method of claim 5, wherein the wear layer is formed to a thickness such that such layer does not visually affect the color of the gemstone when viewed through the wear layer.

17. The method of claim 8, wherein the application of the abrasion wear resistant agent to form the wear layer includes a sol gel process.

* * * * *